United States Patent [19]

Feygenson et al.

[11] Patent Number: 5,288,657
[45] Date of Patent: Feb. 22, 1994

[54] DEVICE FABRICATION

[75] Inventors: Anatoly Feygenson, Hillsboro; Henryk Temkin, Berkeley Heights; Yuh-Lin Wang, North Plainfield, all of N.J.

[73] Assignee: AT&T Bell Laboratories, Murray Hill, N.J.

[21] Appl. No.: 608,093

[22] Filed: Nov. 1, 1990

[51] Int. Cl.$^5$ ............................................. H01L 21/205
[52] U.S. Cl. .................................. 437/90; 437/107; 437/133; 437/946; 437/105; 148/DIG. 50; 148/DIG. 110
[58] Field of Search ................... 437/78, 89, 90, 105, 437/107, 133, 946; 148/DIG. 50, DIG. 110, DIG. 111; 156/610, 612

[56] References Cited

U.S. PATENT DOCUMENTS

| | | | |
|---|---|---|---|
| 3,915,765 | 10/1975 | Cho et al. | 156/610 |
| 3,969,164 | 7/1976 | Cho et al. | 437/107 |
| 3,992,233 | 11/1976 | Farrow | 156/612 |
| 4,371,968 | 2/1983 | Trussel, Jr. et al. | 437/107 |
| 4,589,192 | 5/1986 | Dinan et al. | 437/107 |
| 4,637,129 | 1/1987 | Derkits, Jr. et al. | 437/107 |
| 4,644,381 | 2/1987 | Shieh | 148/DIG. 50 |
| 4,920,069 | 4/1990 | Fossum et al. | 437/90 |
| 5,106,764 | 4/1992 | Harriott et al. | 437/18 |

FOREIGN PATENT DOCUMENTS

| | | | |
|---|---|---|---|
| 0066810 | 3/1985 | Japan | 437/107 |
| 0148616 | 6/1988 | Japan | 437/107 |

OTHER PUBLICATIONS

O. Wada, "Ar Ion-beam Etching Characteristics and Damage Production in InP", *J. Phys. D:Appl. Phys.*, vol. 17, pp. 2429-2437 (1984).

H. Heinecke, et al, "Selective Growth of GaAs in the MOMBE and MOCVD Systems", *J. Crystal Growth*, vol. 77, pp. 303-309.

E. Reichmanis, L. F. Thompson, "Polymer Materials for Microlithography", Ann. Rev. Mater. Sci., vol. 17, pp. 235-271, (1987).

J. P. Hirtz, M. Razeghi, M. Bonnet and J. P. Duchemin, "$Ga_{0.47}In_{0.53}As$/InP Double Heterostructures Grown by Low-pressure Metal-organic Vapour-phase Epitaxy", *GaInAsP Alloy Semiconductors*, pp. 61-83, ed. T. P. Pearsall (1982).

*Primary Examiner*—Mary Wilczewski
*Attorney, Agent, or Firm*—George S. Indig

[57] ABSTRACT

Expedient fabrication of fine-featured integrated circuits entails aperture pattern delineation to produce a masking layer atop a semiconductor body followed by insertion within a controlled atmosphere chamber within which device-functional layered material is epitaxially grown within apertures. Critical, device-consequential properties of epitaxial material is assured by removal of a thin surface layer of material revealed during delineation. Such removal, sufficient to eliminate meaningful contamination and/or crystalline damage introduced during delineation, is of sufficiently small quantity as to be accommodated within the chamber. Under most circumstances, the controlled atmosphere is at reduced pressure as required for e.g. MOMBE epitaxial growth.

21 Claims, 2 Drawing Sheets

DEVICE FABRICATION

BACKGROUND OF THE INVENTION

1. Technical Field

The invention relates to the fabrication of devices built to small design rules-rules from a few micrometers to fractions of a micrometer. A significant category of contemplated devices is Large Scale Integrated devices; electronic, photonic, as well as hybrid circuits entailing both. Processing of the invention depends upon pattern delineation which expediently accommodates critical contaminant and/or crystallographic perfection demands consistent with further processing requiring reduced pressure or other controlled atmosphere.

2. Description of the Prior Art

The role of Large Scale Integrated circuits in present technology is well understood. Semiconductor LSI is all-pervasive—is at the core of the most significant advances, e.g. computer, communication, etc. Recent advances in photonic elements; for example, in edge-emitting as well as surface-emitting lasers, have brought about intense activity in photonic ("optical") LSI as well as in hybrid circuitry containing both photonic and electronic elements.

Fabrication of devices built to small design rules of a few microns to the most advanced commercial circuits built to rules of one micron or slightly less (LSI chips of a fraction of an inch containing a million or more devices-the "megabit" chip) have depended upon extremely sophisticated advances in many areas.

Fabrication of all such devices is critically dependent on lithographic definition. Reducing design rules have brought about changes in the form of the delineating energy need. Fabrication, once dependent upon radiation in the visible spectrum, has been succeeded by ultraviolet "near" UV (included in the spectral range of from 3000 Å to 4000 Å, e.g. using mercury lines at about 3600 Å and 3130 Å). An area of intense worldwide activity directed toward devices built to design rules of 0.5 or 0.6 μm down to perhaps 0.25 μm or smaller, takes the form of prospective substitution of "deep" UV (included in the spectral range of from 1500 Å to 3000 Å, e.g. using mercury lines at about 2540 Å and 1810 Å). This technology thought to be suitable for production of a 64 Mbit chip, will in turn yield to still shorter electromagnetic radiation (x-ray, perhaps in the so-called "long" or "soft" wavelength range of from 50 Å to 300 Å or even in the range below 50 Å), or, alternatively, to use of accelerated electrons (either in the form of direct processing by beam-delineation or of masked "flood" illumination). Relevant x-ray and e-flood techniques are described and claimed in co-pending U.S. patent applications Ser. No. 595,341 filed Oct. 10, 1990 and Ser. No. 498,179 filed Mar. 23, 1990.

Pattern delineation, effectively accommodated by energy of reducing wavelength, has resulted, as well, in activity directed toward appropriate actinic (resist) materials for use in otherwise familiar processings as well as toward alternatives. See, *Annual Review of Materials Science*, vol. 17, pp. 235-271 (1987), "Polymer Materials For Microlithography", E. Reichmanis and L. F. Thompson. Postulated approaches include selectively damaging device-functional material by ion bombardment to result in patterning by selective volatilization or dissolution during "development".

Reducing design rule is accompanied by increasing criticality of a variety of criteria. In particular, demands placed on the various layers of which such devices are constituted become extreme. Extensive activity concerns growth of such layers evidencing necessary perfection—e.g. crystalline perfection as well as prescribed crystalline orientation—and uniformity—compositional as well as dimensional (thickness).

A variety of processes have emerged to meet layer growth requirements. These include Metal Organic Molecular Beam Epitaxy. See "Molecular Beam Epitaxy", M. A. Herman, H. Sitter, Springer-Verlag, 1989 and Metal Organic Chemical Vapor Deposition, and J. P. Hirtz, M. Razeghi, M. Bonnet and J. P. Duchemin in "GaInAsP Alloy Semiconductors", ed. by T. P. Pearsall, J. Wiley & Sons, 1982.

Such vapor deposition processes are necessarily carried out within carefully controlled atmosphere—generally at reduced pressure—and of extreme purity. MOMBE is known to be particularly susceptible to contamination, for example, to adherence-reducing substrate contamination. Chemical residue, for example, residue traceable to resist or resist processing, must be removed to realize the implicit advantages of the deposition process. Requirements become ever-more demanding with still further decrease in delineation wavelength.

Required cleanliness is prospectively thwarted by usual fabrication techniques as applied to state-of-the-art devices. Such fabrication entails deposition of a continuous layer of resist—either positive or negative tone—followed by patterning exposure to selectively decrease or increase rate of removal during development. Development, resulting in evolution of copious quantities of resist, is incompatible with critical deposition steps. Evolution may interfere directly with maintenance of atmosphere, either in terms of composition or of reduced pressure level. Contamination due to resist residue may impact fabrication, e.g. by reducing adherence of subsequently deposited layers, and may otherwise interfere with device functioning.

Such requirements have given rise to fabrication in which pattern delineation is external to controlled atmosphere chambers in which e.g. deposition takes place. While this overcomes one problem, it introduces another. The required breaking of the chamber seal and exposure of pattern-delineated surface to uncontrolled atmosphere gives rise to another form of contamination. Atmospheric contamination may take the form of reaction product, e.g. formation of surface oxide, as well as simple contamination by foreign matter.

Effort to adapt state-of-the-art delineation to such needs are progressing. A particularly useful approach is that of co-pending U.S. patent application, Ser. No. 444,579, filed Nov. 30, 1989, now U.S. Pat. No. 5,106,764. This approach provides for pattern delineation within the controlled atmosphere chamber, thereby permitting vacuum deposition on an uncontaminated surface—on a pattern-delineated surface which has not been exposed to outside atmosphere. Pattern delineation for this earlier "in-situ" procedure depends upon selective removal of extremely thin inorganic resist layers which owe their robustness to chemical bonding to underlying substrate. Promise for this approach is owing to the vastly reduced quantity of released resist material which minimizes interference with processing as well as with ultimate device properties.

SUMMARY OF THE INVENTION

Device fabrication in accordance with the invention depends upon a sequence of processing steps entailing epitaxial growth within a controlled atmosphere-often within an evacuated chamber-following pattern delineation external to the chamber. Avoidance of the various problems generally accompanying exposure of patterned surface to external atmosphere is due to effective removal of surface contaminant as well as surface-damaged material, both within the chamber. The invention is aptly described as representing a departure from state-of-the-art processing. Pattern delineation of device-functional material in accordance with the invention is the consequence of selective deposition rather than of selective removal. Delineation is in the form of aperture-patterning of a layer—thereby producing a masking layer which may or may not serve an ultimate device function-so as to bare underlying substrate upon which deposition takes place. Preferred processes herein depend upon a masking layer of such nature as to effectively restrict deposition to aperture-bared substrate—of such nature as to permit growth on mask layer surface only at substantially reduced or even zero rate. Such preference is of particular significance in many device designs in which the mask layer is retained and ultimately serves a device function. Since patterning takes place outside the chamber, there are no particular demands restricting quantity or composition of material evolved.

The now-patterned device in fabrication is introduced into the controlled atmosphere chamber in which contaminant and/or damaged surface material is removed. Patterning, having been carried out with attention to damage minimization, surface removal, likely to a depth of the order of 1000 Å, reveals sufficiently undamaged material for layer deposition without consequential interference with chamber processing—e.g. without interfering with maintenance of reduced pressure—without meaningful contamination.

As noted, applicability of the inventive teaching is quite broad. Device functional materials, while importantly involving semiconductors may go further. A field of particular significance concerns submicron design rule semiconductors—a field considered quite promising for multi element compositions, e.g. the compound semiconductors. Accordingly, while history has taught us not to disregard elemental silicon, a preferred aspect of the invention is directed to binary and higher order compositions. Compound semiconductors do not share an important characteristic of silicon—in general, the native oxides (oxides of the semiconductors themselves) do not share the robustness of $SiO_2$.

An aspect of the invention involves patterning of a layer produced by deposition rather than oxidation. An example involves deposition of $SiO_2$ on InP. It is this layer which is then aperture-patterned to produce the described mask layer.

Under some circumstances, where surface material within apertures is damaged as well as contaminated, removal may be by a simple step, e.g. by dry etching. Under certain circumstances, it is useful to use a two-step process—i.e. to first cleanse bared material of contaminants—involving removal of perhaps 10 to 100 Å.

All variations of the invention contemplate at least one series of processing steps in which relatively uncontaminated and/or less damaged material, as finally revealed by processing within the controlled atmosphere, serves as substrate for epitaxial growth—possibly by MOMBE or MOCVD. For submicron devices such growth is single crystal, epitaxial, and of thickness likely within the range of 0.5 to 1.5 μm.

Facility offered by the inventive processes give rise, not only to more expedient fabrication of devices that may be fabricated by alternative approaches, but offers unique capability. As an example in this latter category, a self-aligned bipolar transistor of outstanding operational capability is depicted and described.

DETAILED DESCRIPTION

General

The inventive approach is aptly described as depending upon localized epitaxial growth to conform with a desired circuit pattern in lieu of the generally pursued approach of unpatterned growth followed by pattern delineation. A technical paper, "Journal of Crystal Growth", vol. 77 (1986) at pp. 303–309, describes work, which while playing no apparent role in terms of the inventive goal, serves as a valuable resource. The subject matter is that of "localized epitaxial growth of III-V semiconductor films" in accordance with which areas upon which film growth is to be avoided are masked with glassy material such as $SiO_2$ or $Si_3N_4$. The extensive work reported in that paper has been of value, particularly with regard to masking materials/processes.

The inventive processes are of particular value in the fabrication of structures including a large number of small devices as indicated. Such structures, generally referred to herein as integrated circuits, ordinarily provide for interconnection of at least some included devices. The inventive processing is, however, advantageous regardless of such interconnection—is usefully applied to fabrication of chips containing independent elements and/or circuits. Reference to integrated circuits herein is intended to include such structures.

FIGS. 1-5

These figures depict a device in progressive stages of fabrication. Illustrative materials, processing conditions, etc. included in this description are taken from experimental work and as such are to be considered as constituting working examples.

Figure 1:
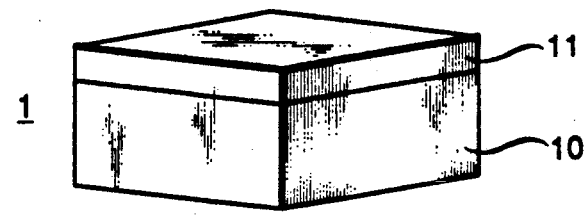
FIGS. 1 thru 5 are schematic perspective views of a device in fabrication in accordance with the inventive teaching.
Figure 2:
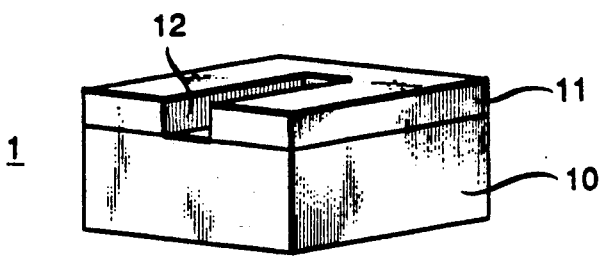

At the stage depicted in FIG. 1 semiconductor substrate 10, e.g. of III-V materials such as InP, possibly as doped appropriate to device function, is shown as carrying deposited layer 11. As discussed herein, selection of the material of which layer 11 is constituted, depends upon a number of factors concerning fabrication, and usually device operation as well. It has been found suitable to produce layer 11 by plasma deposition of $SiO_2$. A variety of considerations including the objective of small design rule circuitry suggests desirability of a thin layer to accommodate small design rule fabrication, while reliably serving masking function-at this time, of thickness likely in the range of from 0.1 to 0.4 μm. The dielectric nature of $SiO_2$ serves well in devices in which masking portions as described in conjunction with FIG. 2 are retained. From the fabrication standpoint, $SiO_2$ serves well in that with proper selection of deposition conditions/materials, deposition may be largely restricted to unmasked (to apertured) regions.

Variations may include substitution of other dielectric materials for the $SiO_2$—may even use semiconductive or conductive materials, perhaps to be retained; perhaps to be removed. Particularly in the former instance, choice may be such as to optimize growth selectivity—such as to minimize growth of successively deposited material on retained portions of the mask layer. Other alternatives include composite layers e.g. of metal and dielectric sublayers.

The device in fabrication as depicted in FIG. 2 shows a layer 11 now pattern delineated to result in aperture 12. As noted, it is a feature of the invention that pattern delineation, resulting in the fabrication stage shown in FIG. 2, is carried out outside of the controlled atmosphere chamber e.g. in which subsequent vacuum deposition takes place. Accordingly, processing may be conventional—may utilize a conventional resist, e.g. such as two-component resist system consisting of a phenolic resin matrix and a diazonaphthoquinone sensitizer of appropriate thickness (a thickness of 1.8 μm was used in one experiment). Pattern delineation took the usual form of selective illumination through a mask (approximately 5 second illumination at a wavelength of 365 nm, followed by one minute development in a standard commercial developer consisting of an alkaline aqueous solution of organic material).

Fabrication of the small design rule devices which are the subject of the invention gives rise to extreme criteria with regard to: e.g. flatness of surface upon which growth is to proceed; uniformity of grown layer thickness/composition, etc. Such objectives are advanced by "self-limiting" procedures e.g. of initial aperture delineation in which dry etch or other removal is essentially terminated upon revealing of underlying substrate. There are occasional circumstances under which processing expediency, e.g. with regard to anisotropic etching/avoidance of undercutting, attainment of desired orientation-dependent sidewall revelation, etc. may interfere with material choices designed to result in such termination. Under such circumstances, it is contemplated that an expendable "stopping" layer may be deposited prior to deposition of the masking layer. This "stopping" layer may then serve as the etch-limiting material. After this function is served, it may be removed-likely, but not necessarily within the controlled atmosphere.

Figure 3:
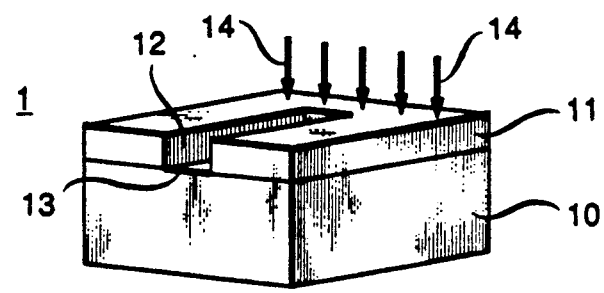

In FIG. 3 the device in fabrication has now been loaded into the vacuum apparatus. The procedure taking place is cleaning to remove residual contaminants from the bottom 13 of groove 12. Under many circumstances, this cleaning step may be a part of the etch-removal step of FIG. 4. Under certain circumstances, however, cleaning is a distinct separate procedure as shown. Arrows 14 represent e.g. argon ion bombardment. For bodies 10 of compound semiconductor, sufficient contamination removal has been found experimentally to be accompanied by removal of 10 to 20 Å of material—of native oxide formed in the openings, such as groove 12, of the mask layer 11. A dose of Ar ions of $2-5 \times 10^{15} cm^{-2}$ within an energy range of 100-200 electron volts has been found adequate.

Even at such low energies, the Ar ion bombardment results in device-consequential damage within now-cleaned surface 13. Damage removal may be accomplished by exposing the wafer 1 to gaseous chlorine, $Cl_2$—to result in the etching step represented in FIG. 4. If surface 13 is free of chemically combined, oxidized material, e.g. free of native oxide, it is possible that the etch step of FIG. 4 may be carried out directly without the cleaning step represented by FIG. 3. (Other circumstances which may dictate cleaning, even in the absence of oxidized surface, concern the nature of contamination, the composition of wafer 1—or more precisely the composition of surface 13, and the nature of the etch step itself.)

Figure 4:
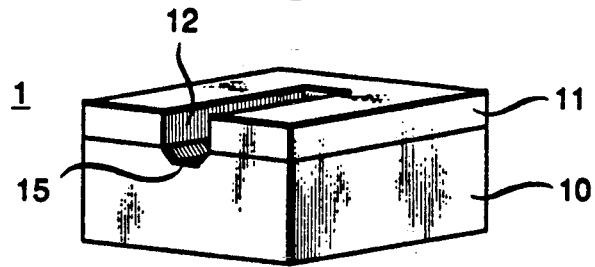

In FIG. 4 wafer 1 as depicted, has been etched, without removal from the chamber, to result in etched depression 15. The particular confirmation shown is that which results for {111} crystallographic orientation. Surface 13 as presented to processing completed in accordance with FIG. 4, was free of oxidized surface material, whether by removal as described in conjunction with FIG. 3 or by avoidance during preceding processing. Such uncombined surface can be etched with $Cl_2$ at temperatures higher than that required for thermal desorption of reaction products (in the instance of InP etching by $Cl_2$, the chlorine-combined reaction products, $InCl_3$ and $PCl_3$). Maintenance of such a sample at this stage at 200° C. resulted in etching at a rate of 500 Å/min. in a partial pressure of $Cl_2$ of $5 \times 10^{-4}$ torr. In general, for the InP example referred to in this description, removal of device-consequential damaged material was accomplished by removal of a maximum of 1000 Å depth. Variation in etch time and feature orientation may result in selective revealing of {111} planes of either In or P.

It has been indicated that avoidance of chemically combined (oxidized) surface 13 material may, dependent upon the nature of any other contaminant, permit direct etching as in FIG. 4. Alternatively, initial patterning as discussed in FIG. 2, if achievable without introduction of device-consequential damage, e.g. by use of sufficiently low delineation energy, could result in elimination of the etch removal of FIG. 4. At this time, however, time-expedient delineation procedures do introduce device function-consequential damage, at least in the instance of submicron design rule fabrication.

Figure 5:
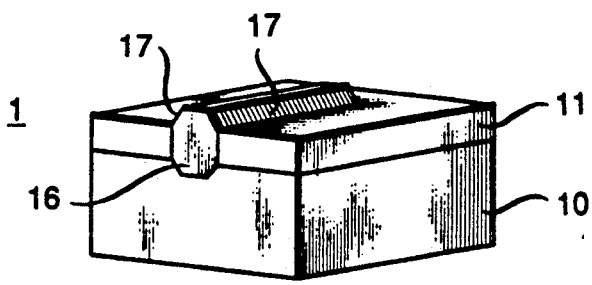

The clean and damage-free patterned sample is next subjected to vacuum growth e.g. by MOMBE, to result in the fabrication stage shown in FIG. 5. As depicted, groove 12 is now filled with epitaxially grown semiconductor material to a thickness of perhaps 0.5-1.5 μm. The deposited material 16 has sloping side walls 17 for the particular growth conditions, crystallographic orientation and composition, such sidewalls being the result of slower growth on {111} In planes.

A desirable category of processes in accordance with the invention provides for retention of the masking layer. In some instances, the retained layer may serve a purpose during subsequent fabrication, e.g. may serve for alignment of successive layers, together constituting a laser. The retained layer may serve a device function, e.g. may serve to electrically isolate elements constructed in apertures. Finally, it may be tolerated-while serving no explicit device function, may simply not interfere with device functioning. Under some circumstances, removal of the masking layer may be indicated. Regions revealed by removal may serve as sites for additional circuitry. Alternatively, it may be useful to cover the fabricated device with an encapsulating layer contacting so-revealed surface.

Whereas retained layers are generally of prescribed characteristics, e.g. dielectric/insulating, always with respect to the ultimate device, greater flexibility is afforded where masking layers are to be removed. Under such circumstances, layers may even be of metallic conductivity, or generally of such material as dictated by fabrication/removal considerations alone.

The inventive departure depends upon cleaning and/or damage removal being carried out within a common evacuated atmosphere with that in which the deposition of FIG. 5 takes place. While this can be carried out in a single evacuated chamber, convenience-diversity of process requirements-likely gives rise to use of a separate chamber, however, interconnected with the deposition chamber so as to share a common atmosphere—so as to avoid exposure of the processed growth surface to uncontrolled atmosphere prior to deposition.

More than any other single factor, the invention depends upon epitaxial growth on sufficiently undamaged, sufficiently contamination-free, revealed substrate material to yield grown material of requisite device function need. Particularly for submicron design rule, electronic circuitry, it is the inventive teaching that this is expediently satisfied only by cleaning and/or damage removal to result in revealed growth substrate of high perfection. Data, e.g. as plotted in FIG. 6 has been found a sufficient measure for judging attainment of such perfection—of perfection as to reliably yield device grade material both for the preferred device category of submicron silicon or non-silicon electronic circuitry and for fabrication of larger circuitry where function gives rise to preference for the non-silicon (III-V or other compound semiconductor) bandgap need implicit in device operation—e.g. for electromagnetic radiation as in deposited edge-emitting or surface-emitting laser structures.

Figure 6:
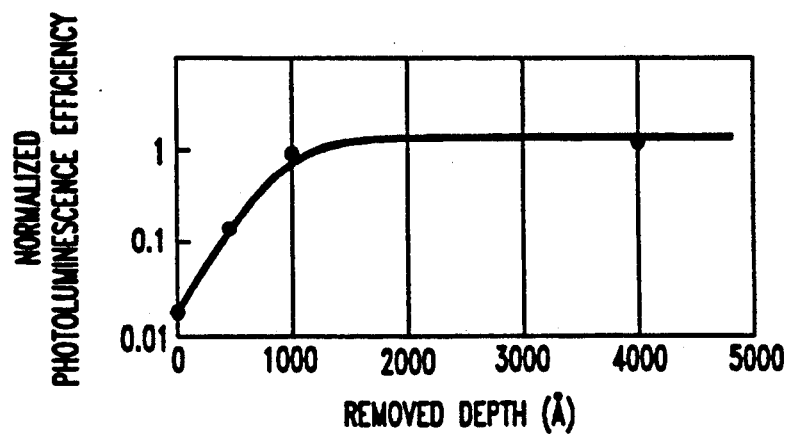
FIG. 6 on coordinates of normalized photoluminescence efficiency on the ordinate and removed depth on the abscissa relates these two parameters during the process step as carried out within the controlled atmosphere chamber.

FIG. 6 is a plot of normalized photoluminescence efficiency on the ordinate and removed depth of material in Å. The values plotted should be regarded as illustrative only. It is the form of the curve rather than the particular values represented which is significant. The curve in FIG. 6 levels—stabilizes—at a removal depth of approximately 1000 Å. It is this curve characteristic, rather than any particular numerical value, which indicates revealing of intrinsic body characteristics-i.e. revealing of a surface free of the contaminant and/or damage attendant on pattern delineation external to the chamber. For the example plotted, removal of ~1000 Å results in revealing of such surface—in a surface upon which epitaxial growth results in contaminant-free grown material of the orientation and perfection of the untreated body. Under conditions other than those used in preparation of the sample for which the data is plotted, greater or lesser removal depth may be required/sufficient. Of course, attainment is of material of the excellence of that of the wafer body-it is an implicit requirement that the wafer body evidence requisite device-consequential properties. Fabrication of wafers evidencing such properties is in accordance with well-known procedures. See, for example, "High Speed Semiconductor Devices", ed. S. M. Sze, Wiley Interscience Publication, (1990), describing growth of appropriate wafer material for many of the compound semiconductor compositions as well as for silicon.

The data plotted on FIG. 6 is for an InGaAs/InP double heterostructure grown on Ar bombarded and $Cl_2$ etched surface of InP. Such structure as grown on a surface which was not cleaned and/or etched to result in photoluminescence constancy as represented in FIG. 6 does not yield device-grade deposited material. The criterion of photoluminescence is a useful one—Ar bombardment without removal of damaged material resulted in luminescence efficiency almost fifty times weaker than that for the sample prepared in accordance with the inventive teaching.

Photoluminescence efficiency is, of itself, an appropriate monitoring technique for the purpose of qualifying treated product. Photoluminescence is an approach implicitly suited to semiconductor material growth—due to the necessary presence of the same bandgap upon which semiconductivity is dependent. The particular data plotted is basically emission brightness, with maximization (leveling as plotted) dependent upon removal of non-radiative recombination centers associated with damage sites. Other criteria establishing requisite structural perfection/purity may serve, but regardless of the criterion used, attainment of body characteristics—attainment of requisite growth surface—invariably signals leveling of photoluminescence as shown on the figure (always providing body material is, of itself, of requisite device grade). Accordingly, it is appropriate to qualify material surface for growth in these terms.

Adequate measurement of normalized photoluminescence efficiency is well-known and is described in the literature. See, O. Wada, *J. Phys. D.: Appl. Phys.*, vol. 17, p. 2429 (1984).

EXAMPLE 1

The InGaAs/InP bipolar heterostructure transistor referred to is grown as follows. The procedures described in conjunction with FIGS. 1 through 5 are followed. A 0.3 μm thick InP layer is grown by MOMBE at a temperature of 500° C. on an n+ InP substrate covered with a patterned layer of $SiO_2$—as cleaned and etched in the manner described in FIGS. 3 and 4. This layer serving as collector is followed by $SiO_2$ layered deposition, patterning, cleaning, etching (the latter always in the evacuated chamber), and by deposition to result successively in a 0.06 μm thick base layer of InGaAs (doped p-type to a level of $1 \times 10^{18} cm^{-3}$ and a 0.4 μm thick InP emitter layer. The structure is terminated with an InGaAs contact layer, approximately 0.1 μm thick. Completion of the structure is by delineation of the emitter mesa followed by formation of Ohmic contacts. The perimeter of the emitter-base junction is thus formed by conventional processing. The collector-base junction is selectively grown and not patterned after growth. The resulting transistor shows very high common-emitter gains, as high as 8000, and operates at very low base current level of 500 nÅ.

Figure 7:
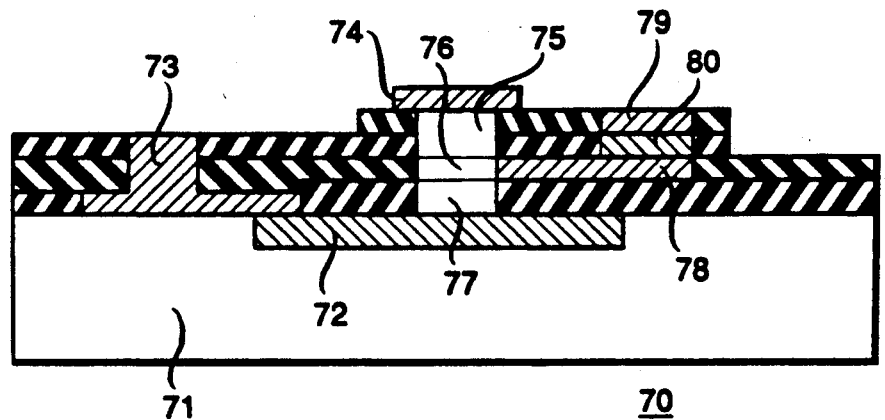
FIG. 7 is a front sectional view of a device—in this instance of a bipolar transistor—illustrative of devices which may be fabricated.

FIG. 7 depicts a semiconductor device thought to be uniquely manufacturable by means of the inventive process. The device shown, a bipolar transistor 70, consists of semi-insulating (e.g. for III-Vs, resistivity greater than $10^6$ ohm-cm) iron-doped InP region 71 containing n+ subcollector region 72 to which Ohmic contact 73 is connected. Emitter contact 74 overlies the grown transistor structure consisting of n+ emitter region 75, p-type base region 76, and n-type collector region 77 in that order. Collector region 77 is in contact with subcollector 72. Metal region 73 serves as contacting electrode to subcollector 72. Connection to base 76 is via metal layer 78 in turn contacted by external metal electrode 79, via heavily doped region 80. The remaining unnumbered regions are of oxidic, dielectric material serving during fabrication, and for confinement, but of no other functional consequence.

Processing in accordance with the invention was used in cleaning and/or damage removal preceding growth of each of transistor regions 75, 76 and 77 in accordance with the discussion of FIGS. 1 through 5. The completed structure as depicted is planar, and self-aligned. Self-alignment permits expedient submicron scaling e.g. of a transistor of lateral dimension ~0.75 μm as contacted by a 1.0 μm electrode 74.

Figure 8:
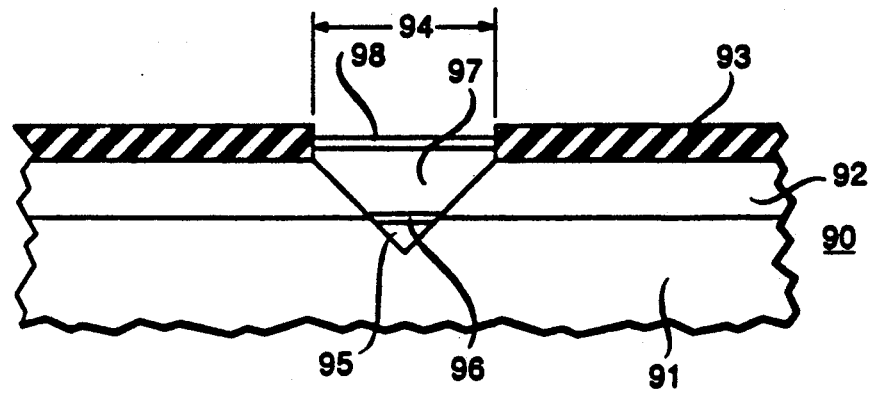
FIG. 8 is a front sectional view of a photonic device—in this instance of an edge emitting laser expediently fabricated in accordance with the inventive process.

FIG. 8 depicts a laser structure 90 which may be fabricated in accordance with the inventive processes. Structure 90 is formed by selective area epitaxy on a semiconductive wafer, e.g. on a (100) crystallographically oriented, n-type InP wafer represented by region 91. Region 92, e.g. Fe-doped InP is produced by conventional technique, following which dielectric layer 93, e.g. of $SiO_2$ is deposited. Patterning to produce aperture 94 is, as discussed, carried out external to the vacuum chamber, prior to insertion within the chamber. Cleaning and/or etching, the latter perhaps in free $Cl_2$, orientation of opening 94 in the (011) direction, while controlling its width and etch time results in the triangular shape shown. The laser structure grown within the now damage-free opening consists of n-type buffer region 95 followed by active layer 96, illustratively n-type active layer of InGaAs, by cladding region 97, perhaps of p-type InP, and finally by p+ contact layer 98, of InGaAs, for the example shown.

The initial opening 94 is perhaps ~1 μm in width. Current confinement is assured by formation in epitaxially grown semi-insulating material e.g. in Fe-doped InP region 91. Alternatively, a p-type layer or p-n junction may be formed epitaxially or by diffusion in the substrate. Damage-free sidewalls of the triangular opening allow placement of active layer 96 low in the groove, thus resulting in the desired small transverse dimension.

A promising class of laser structures now receiving considerable attention is the vertical cavity Surface Emitting Laser. Such structures, likely to emerge in belated satisfaction of predicted high density laser integration, are presently fabricated by growing planar structures which are then etched to result in separated devices. Etch-separation is anisotropic and offers danger of device meaningful damage to exposed sidewalls. Selective growth in dielectric windows as described for example in FIG. 8 may relax subsequent processing difficulties.

We claim:

1. Process for fabrication of integrated circuit, designed in accordance with design rule of 1 μm or smaller, such process at least including a sequence of process steps performed on a body comprising a substrate of device-functional material supporting a first layer, such process entailing aperture pattern delineation of the first layer to expose patterned material underlying such layer, followed by epitaxial growth within a controlled atmosphere of a second layer substantially of the pattern as so delineated, said second layer including device-functional material, CHARACTERIZED in that pattern delineation comprises a first process step carried out outside of such controlled atmosphere during which delineation reveals an initial patterned surface, and in that the body in fabrication is next introduced into such controlled atmosphere in which an additional process step is carried out wherein surface material including material revealed by initial patterning is removed to a depth necessary and for the sole purpose of revealing a final growth surface, such revealed surface now evidencing a degree of crystallographic damage, and/or contamination less than that resulting from initial delineation and wherein depth of material removed in the additional process step is sufficiently small as to have minimal device operation consequence.

2. Process of claim 1 in which a substantial portion of the final growth surface revealed is single crystal.

3. Process of claim 2 in which aperture pattern delineation exposes material of the composition of such substrate.

4. Process of claim 3 in which the said controlled atmosphere is a reduced pressure atmosphere.

5. Process of claim 4 in which said growth comprises a growth process dependent upon a mechanism selected from the group consisting of physical condensation, chemical association, and chemical dissociation.

6. Process of claim 5 in which the said growth process is heterogeneous.

7. Process of claim 6 in which the said growth process consists essentially of MOMBE.

8. Process of claim 6 in which the said growth process consists essentially of MOCVD.

9. Process of claim 4 in which the said growth proceeds at a substantially greater rate on the final growth surface as compared with that upon remaining surface of the said first layer.

10. Process of claim 9 in which relative growth rates are determined by the nature of the final growth surface as compared with that of the remaining surface.

11. Process of claim 10 in which the said first layer is a deposited layer and in which the said substrate consists essentially of a compound semiconductor.

12. Process of claim 11 in which the said first layer consists essentially of a compound of silicon.

13. Process of claim 12 in which the said compound is selected from the group consisting of $SiO_2$ and $Si_3N_4$.

14. Process of claim 10 in which the said first layer is a chemical compound produced by chemical reaction with the said substrate.

15. Process of claim 1 in which the said substrate constitutes the bulk of the said body prior to processing.

16. Process of claim 1 in which the said substrate is a grown layer.

17. Process of claim 1 in which the said integrated circuit includes electronic devices and in which fabrication is to design rule of less than 1 μm.

18. Process of claim 17 including at least one electronic device, the fabrication of which entails sequential growth of at least two device-functional layers within a common aperture as produced during said aperture pattern delineation, so that the resulting device is self-aligned.

19. Process of claim 17 in which fabrication is to design rule of less than 0.5 μm.

20. Process of claim 1 in which the said integrated circuit includes active photonic devices.

21. Process of claim 1 in which said integrated circuit includes interconnected devices.

* * * * *